(12) United States Patent
Mitchell et al.

(10) Patent No.: US 6,911,834 B2
(45) Date of Patent: Jun. 28, 2005

(54) MULTIPLE CONTACT VERTICAL PROBE SOLUTION ENABLING KELVIN CONNECTION BENEFITS FOR CONDUCTIVE BUMP PROBING

(75) Inventors: Scott W. Mitchell, Plano, TX (US); Reynaldo M. Rincon, Richardson, TX (US); Jerry Broz, Longmont, CO (US); Gerard Laugier, Villeneuve Loubet (FR)

(73) Assignee: Texas Instruments Incorporated, Dallas, TX (US)

( * ) Notice: Subject to any disclaimer, the term of this patent is extended or adjusted under 35 U.S.C. 154(b) by 32 days.

(21) Appl. No.: 10/058,544

(22) Filed: Jan. 25, 2002

(65) Prior Publication Data

US 2003/0141883 A1 Jul. 31, 2003

(51) Int. Cl.[7] .............................................. G01R 31/02
(52) U.S. Cl. ...................... 324/754; 324/761
(58) Field of Search ......................... 324/725, 754–758, 324/765, 158.1, 761–762; 437/174, 169, 482, 912

(56) References Cited

U.S. PATENT DOCUMENTS 5,982,187 A * 11/1999 Tarzwell .................. 324/756
6,404,213 B2 * 6/2002 Noda ....................... 324/754

* cited by examiner

Primary Examiner—Minh N. Tang
(74) Attorney, Agent, or Firm—J. Dennis Moore; W. James Brady, III; Frederick J. Telecky, Jr.

(57) ABSTRACT

Apparatus and methods for testing conductive bumps or target test points on integrated circuits. A multiplicity of probes are extended through a support substrate. At least one of the multiplicity of probe locations include a second electrically isolated probe such that the test point is in contact with two probes. One of the two probes provides a voltage to the test point and the second probe sensing the voltage so as to provide a Kelvin connection.

22 Claims, 3 Drawing Sheets

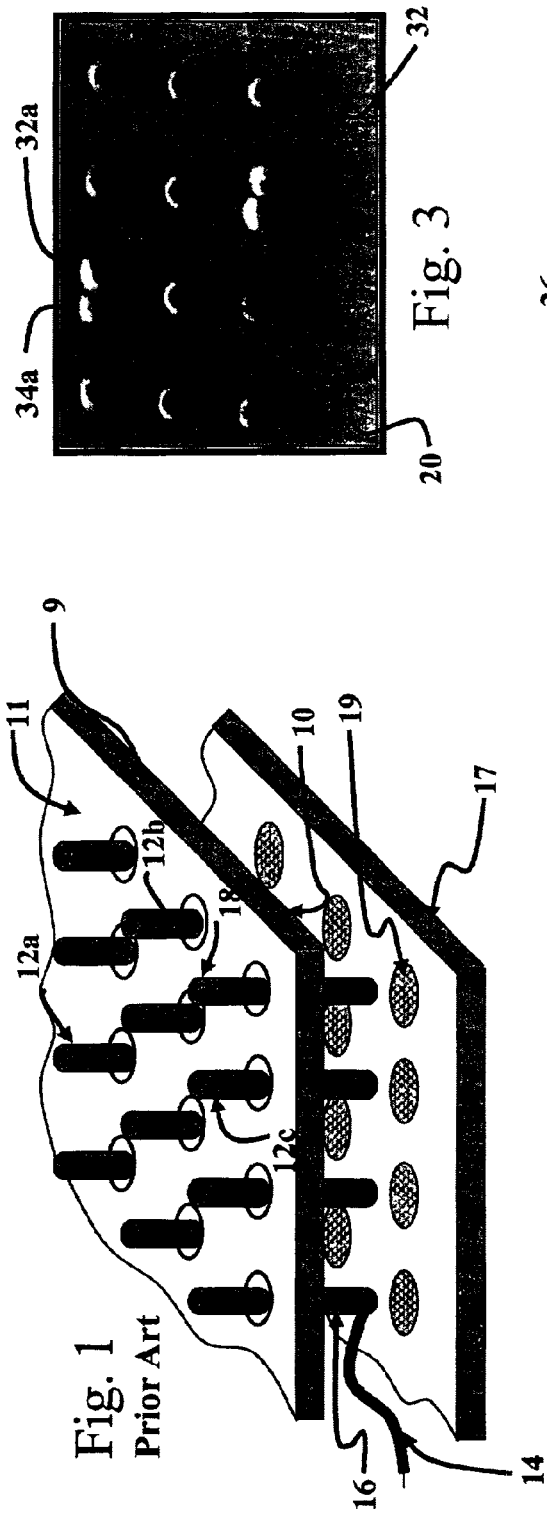
Fig. 1
Prior Art
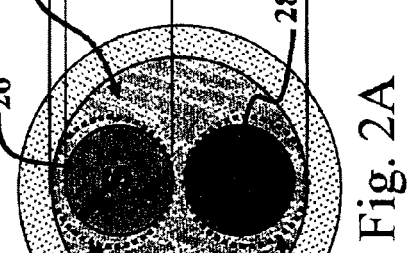
Fig. 2A
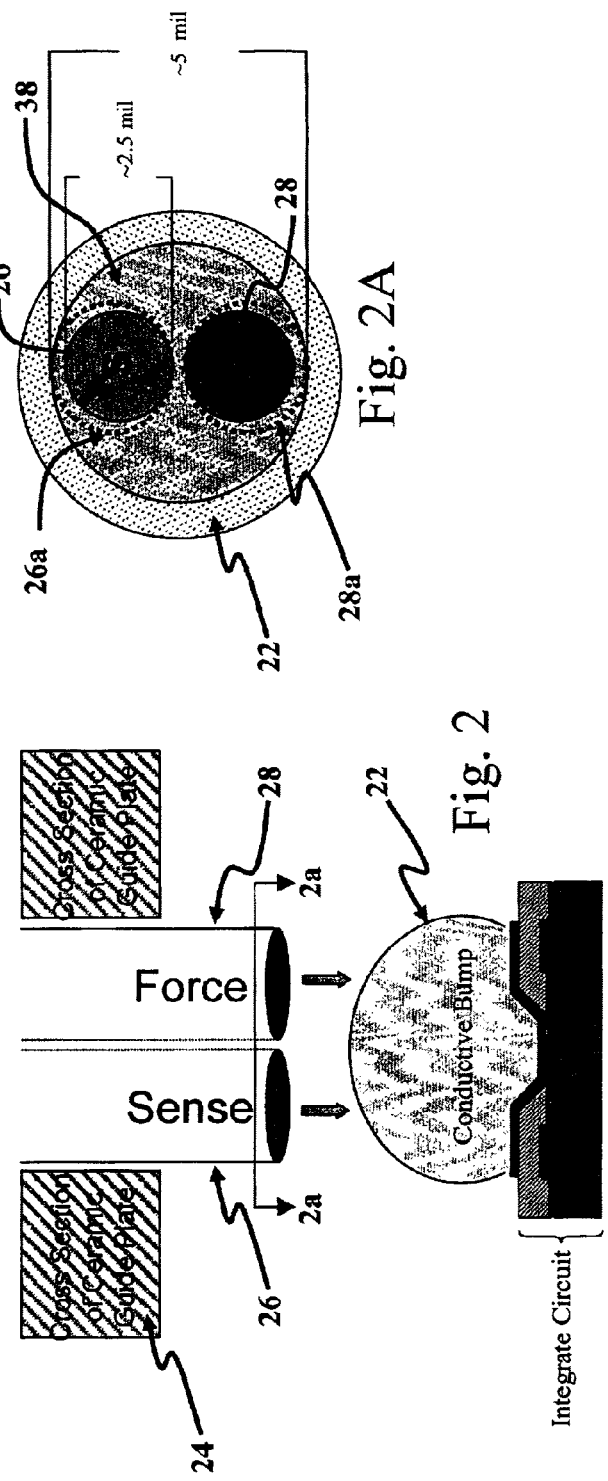
Fig. 2
Fig. 3

MULTIPLE CONTACT VERTICAL PROBE SOLUTION ENABLING KELVIN CONNECTION BENEFITS FOR CONDUCTIVE BUMP PROBING

FIELD OF THE INVENTION

This invention relates to testing of circuits (such as integrated circuits) having a large number of contact points such as conductive bumps or conductive balls. More specifically, the invention relates to a probe card used in such testing which minimizes the effect of IR voltage drops due to residue, oxide barriers and the like on the surface of such conductive ball connections. These surface contaminates create a thin insulative layer between the probe tips of a probe card and the conductive ball contact points or target test points.

BACKGROUND OF THE INVENTION

Probing on conductive bumps, or balls, during wafer level test to make an electrical connection to the integrated circuit (IC) device is typically accomplished during a single pass or contact between a probe card and the IC device. The conductive ball, or bump, application process is intrinsically unclean. In addition to the natural oxide barriers, there are residual organic materials that remain on the surface of the conductive balls. These contaminants create a thin insulating layer that makes it very difficult to achieve and maintain very low contact resistances between the probe needle and the bump, thus, negatively affects test results and ultimately reducing device yields.

As an example, an integrated circuit device containing an Analog to Digital Converter (ADC) typically requires test verification. The test verification of two key parameters F(full scale)set and Z(zero)set is usually considered critical in such cases. Unfortunately, contact resistance during bump probing is often too high to correctly validate the operation of the ADC for these two parameters.

Further, the magnitude and stability of contact and circuit resistances during wafer level test may be dramatically affected by probe, material, and setup related factors.

Some of the factors affecting resistance include, but are not limited to:

Probe needle composition and physical dimensions;

Probe card design, (e.g. planarity of the probe card can vary between ~±25.0 um;

Bump height variations which may vary between ±15 um;

Variations due to travel of the probe card ranging between 40 um to 60 um); and

Build-up of adherent contaminants on the probe tip contact surface resulting from multiple touchdowns.

Consequently, in order to control the contact resistance, keep the contact surface free of contaminants, and to stabilize yield, probe cards are frequently cleaned using an abrasive lapping film. This cleaning process reduces probe or tip length. As a result, probe cards are often prematurely "worn-out" due to excessive abrasive cleaning.

Typically, the probe test flow and ADC IC is to probe peripheral Aluminum pads with Tungsten Rhenium needles during which probe test Fset and Zset are validated. Then the bumps are put on the device. However, most customers require validation of the Fset and Zset parameters following the bump application process. Since the final device is sold to the customer without a package interface, final testing of these parameters at an Assembly Test site is not an option.

Furthermore, current probing techniques on bumps prohibits the re-verification of the test, because of the resistive issues described above.

If full testing on the bump connections were possible, the probe step on the Aluminum pads could be eliminated. Elimination of this probe step therefore would at a minimum double throughput on the probe floor for the ADC device.

SUMMARY OF THE INVENTION

Objects and advantages of the invention will in part be obvious, and will in part appear hereinafter, and will be accomplished by the present invention which provides methods and apparatus for making electrical contact with an array of target tests or contact points, such as conductive balls or conductive bumps (including but not limited to solder balls or bumps) by a probe card testing apparatus. The apparatus comprises a support substrate made of a non-conductive material which has a working surface and a back side. A multiplicity of probes extend from a first end of each of the probes on the back side of the substrate through the substrate to a contact end intended to make contact with the conductive ball or conductive bump connections on an integrated circuit or other circuit. The contact ends of the multiplicity of conductive probes extend a selected distance beyond the working surface of the support substrate and terminate at a multiplicity of locations which are arranged according to a pattern which corresponds to the mirror image of the pattern of contact points on the circuit being tested. For accurate testing of certain critical circuits which may be adversely affected by contaminating films formed from residue or oxides on the surface of conductive ball or conductive bump connections, the present invention includes two probes which are in close proximity, but electrically isolated from each other and contact a single conductive bump or test connection. The two parallel or proximate probes will typically be a "sense" probe, and a "force", or voltage probe used for making a Kelvin connection. It will also be appreciated that it may be desirable to have a third probe which will typically operate as a second "force" probe. The probes extending through the insulative substrate are of course positioned such that they make electrical contact with the contact point or conductive bump on a circuit to be tested when that circuit is placed against the apparatus or probe card.

BRIEF DESCRIPTION OF THE DRAWINGS

The above-mentioned features as well as other features of the present invention will be more clearly understood from the consideration of the following description in connection with the accompanying drawings in which:

FIG. 1 is a representation of a prior art probe card having a multiplicity of probe tips suitable for being placed against the conductive bumps of an integrated circuit. It is noted that the individual probe tips of the probe card make a single connection with an individual conductive bump or test point.

FIG. 2 is a side schematic view of a pair of probe tips according to the teachings of the this invention, both of which makes contact with a single conductive ball or conductive bump connection.

FIG. 2a illustrates a section view along line 2a—2a of the two probe tips of FIG. 2.

FIG. 3 illustrates a portion of a probe card incorporating multiple probe tip arrangement of the present invention for use with circuits adversely affected by insulating residue or oxide film.

FIG. 5 shows a partial section of a probe card illustrating the three probe tips which contact a single conductive ball connection of FIGS. 4 and 4a.

DESCRIPTION OF PREFERRED EMBODIMENTS

Figure 4:
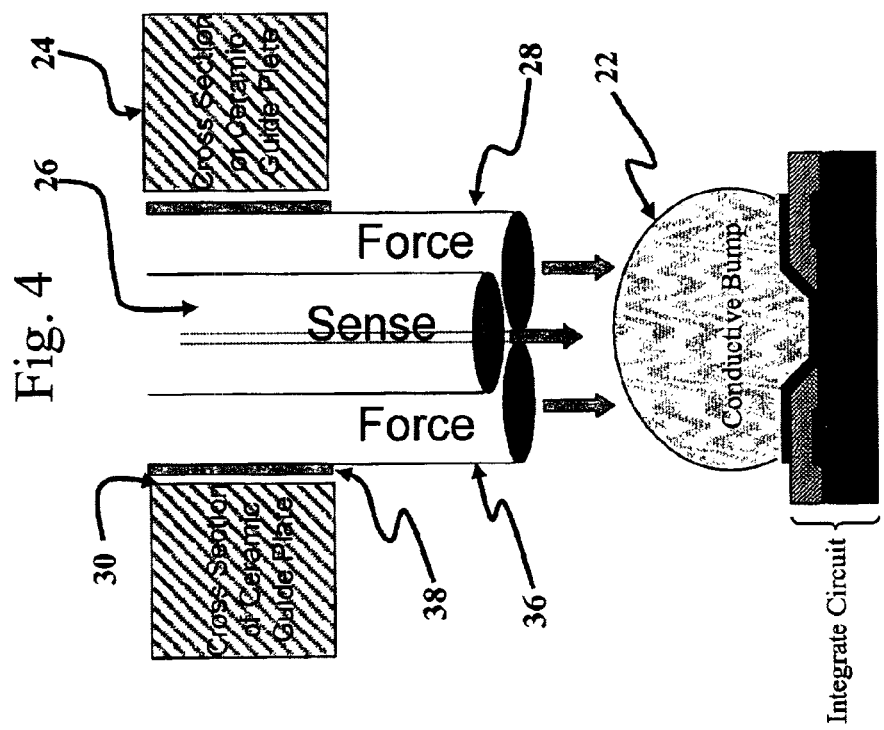
FIG. 4 illustrates another side view of an embodiment of the present invention wherein three probe tips are used to contact a single conductive ball or conductive bump connection.

Referring now to FIG. 1, there is shown the bottom and partial perspective view of a prior art probe card using individual probes to contact each of the conductive ball contact or test points of a circuit being tested (such as for example, an IC or Integrated Circuit). It will be appreciated that the conductive ball contact points may include but are not limited to solder connections such as Lead-Tin, Silver and the like. As shown, the probe card typically comprises a non-conducting guide structure 10 which is typically planer and which guides a plurality of probes or probe tips (including probe tips 12a, 12b and 12c) which are arranged within the substrate 10 in a selected pattern which is a mirror image of the pattern or array of conductive ball or conductive bump contact points or test connections on a circuit to be tested.

The back end of each of the individual electrically conductive probes are connected to a conductive path such as a wire 14 connected to the back end 16 of each of the probes located on a back side 9 of substrate 10. As shown, each of the probes extend through substrate 10 and terminate at a contact end 18 which extends slightly beyond (e.g. about 5 mm) to the front side or working surface 11 of substrate 10. As will also be clear to those skilled in the art, the back end 16 of the individual conductive probes may alternatively terminate at and be in electrical contact with conductive contact pads 19 of a space transformer substrate. The conductive pads 19 will typically lead to individual connection points at a convenient location on the probe card or space transformer substrate 17. Thus, as will be appreciated by those skilled in the art, to test a circuit using a prior art card such as shown in FIG. 1, the probe card is placed against the circuit to be tested so that the probe tips or contact ends contact the individual conductive ball or bump connections and make an electrical connection. The appropriate testing procedures are then followed. However, as is well-known by those skilled in the art, using such probing of conductive bumps or conductive balls during wafer level tests is preferably a single pass contact test. That is, the contact ends or tips of the probes are intended to make a one time or single contact or pass with the bumps on the circuit. Unfortunately, as mentioned above, such conductive ball or bump connecting processes are intrinsically unclean. For example, there are natural oxide barriers which form on non-precious metal conductive ball connections of the circuitry. As is known by those skilled in the art, such an oxide barrier creates a thin insulating layer between a contacting probe tip and the circuit. In addition to such natural oxide barriers, a residual material often remains on the conductive ball connections. The residual material results from various sources such as the manufacturing, shipping, packing and handling processes occurring during the construction of the circuitry. The thin insulating layer created by these contaminants presents high contact resistance between the probe tips or needles and the conductive bump, and thereby negatively affects the test results. Unfortunately, these negative effects ultimately reduce the yield.

The probe card device of the present invention provides a technique to minimize the effects of such IR drops resulting from the thin insulating layers formed by residue and oxides. Thus, although it is common practice within the semiconductor industry to provide a force and sense line or a Kelvin connection, to minimize the effects of voltage IR drops in an electrical circuit, the present invention advantageously applies the Kelvin connection, and methodology at the IC probe level to offset the IR drop associated with the previously mentioned resistive film conductive ball problem. Existing probe card technologies simply do not include such IR compensation down to the conductive ball or test point connection. A Kelvin connection refers to supplying separate voltage source and sense lines from the measurement supply source to the point of contact and adjusting the applied voltage until a selected voltage is sensed. This voltage sensing insures that the required voltage is applied at the point of contact, and negates or nullifies the error in voltage drops either in the line trace or contact resistance.

Therefore, referring now to FIG. 2, there is shown a side view of parallel probe tips or needles used to contact a single conductive ball connection or test point according to the teachings of the present invention. As shown, there is a integrated circuit 20 with a conductive ball contact point 22. As will be appreciated by those skilled in the art, the conductive ball contact point 22 will often have a thin oxide layer on the surface thereof as well as a thin layer of residual organic. This thin layer of oxide and other residual materials presents a high impedance to a contact probe.

Thus, according to the present invention, there is shown a typical cross-section of a ceramic guide plate or support substrate 24 which supports an array of probe needles according to a selected pattern for contacting a multiplicity of conductive ball connections or target test points such as conductive ball connection 22. As will be appreciated by those skilled in the art, the pattern selected for the array of probe needles or tips will be a mirror image of the array or pattern of the conductive ball connection on the circuit being tested. Please note that the ball or bump connection 22 may will vary in diameter based on a varying array pitch on the integrated circuit. However, although many, if not most of the individual probe needles which contact conductive balls 22 will be individual probe needles, according to the present invention, there is also included at least one a pair of probe needles 26 and 28, both of which are located side by side supported by ceramic guide plate 24. It will be appreciated that the non-conductive substrate may be formed around the probe needles 26 and 28, or alternatively, apertures, such as aperture 30, may be formed in the substrate according to a desired pattern and the probe needle is then inserted into the apertures. It should also be understood that the diameter of the probes or needles 26 and 28 may vary in diameter based on the bump or ball pitch. In the embodiment shown, probe 26 is a "sense" probe and probe 28 is a "force" probe typically used in making a compensated or Kelvin connection to the conductive ball 22. Each of the probe needles or wires 26 and 28 will be insulated from each other such as by an insulating coating so that the two parallel and proximate needles 26 and 28 are not in electrical contact with each other. FIG. 2a illustrates a sectional view of the two needle probes along line 2a—2a looking down at the conductive ball 22.

FIG. 3 illustrates a portion of the probe card similar to that as shown in FIG. 1 except two locations through the substrate of the probe card include two parallel probe needles such as needle pair 32 and 34 and needle pair 32a and 34a as discussed above.

Referring again to FIG. 2a, an example only of typical probe needles and conductive balls is illustrated. In the example shown, probe needles 26 and 28 each have a diameter of about 2.5 mills, whereas the overall diameter of the associated target or conductive ball connection is shown to be somewhat greater than 5.0 mills. Again, the diameters of the needles and the conductive bumps or balls are not fixed and may vary based on the test application, bump or ball pitch, or configuration of the present invention needle configuration. For example, the probes 26 and 28 may be located within an area which is smaller than the conductive bump or target test point as shown in FIG. 2, or alternately probes 26 and 28 may be located within an area greater than the size or diameter of the conducive bump as indicated by dotted lines 26a and 28a.

Figure 5:
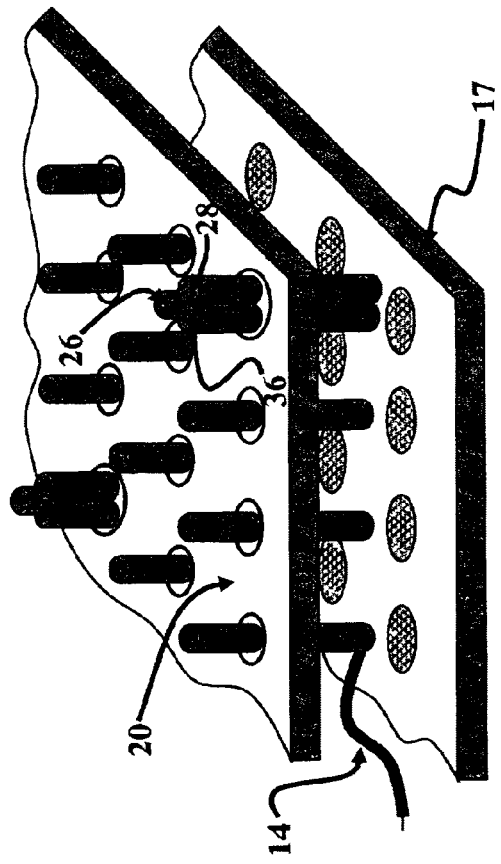
Figure 4A:
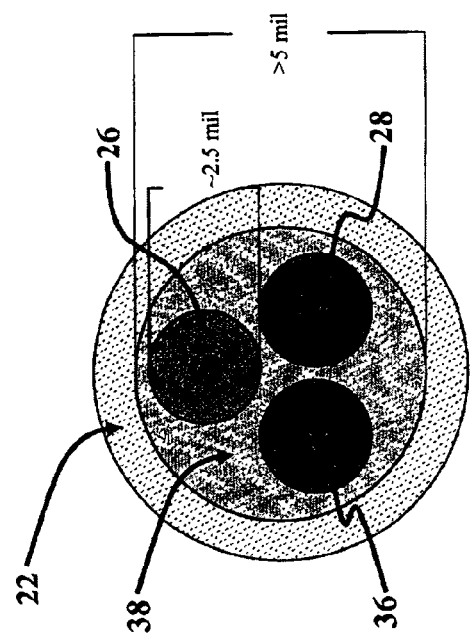
FIG. 4a shows a bottom view of the three probe tips of FIG. 4.
Figure 5:
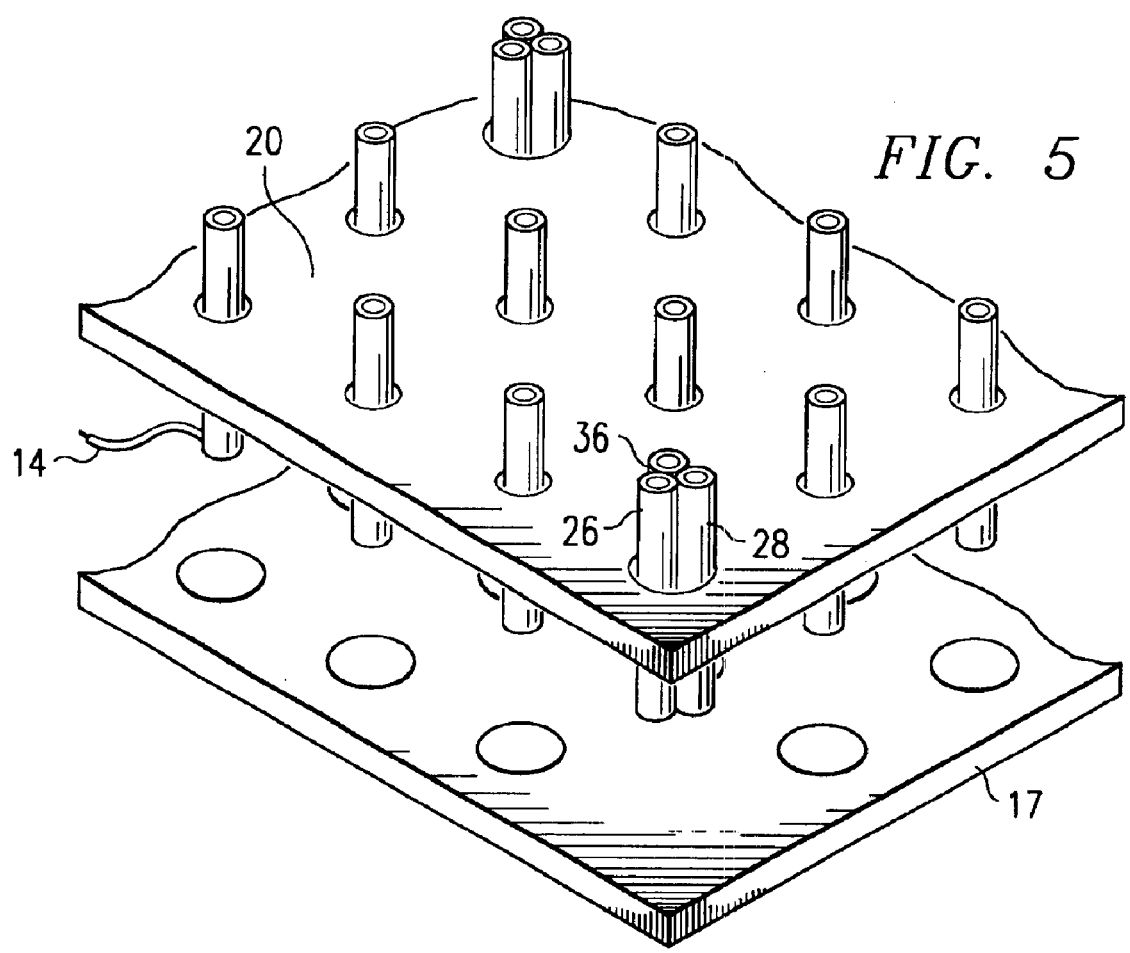

Referring now to FIGS. 4, 4a and 5, there is shown another embodiment of the present invention wherein three parallel probes in close proximity to each other are used to contact a single target test point or conductive ball connection 22. Portions of FIGS. 4, 4a and 5 which are similar to the embodiment discussed above will include the same reference numerals. Thus, as shown in FIGS. 4 and 4a, there are included the two probe needles 26 and 28 as was discussed with respect to FIG. 2 as well as a third probe needle 36 which also extends through the aperture 30. Aperture 30 supports all these probe needles. In the illustrated embodiment of FIG. 4 and 4a, the third probe needle 36 is also a "force" probe needle used in a Kelvin-type sensing circuit. It is noted, however, that even using the three probe needles, the footprint or area taken up by the needles may still be less than the conductive ball diameter itself, or may exceed the ball diameter, and therefore all three probe needles will make contact with the conductive ball at the same time. The embodiment in FIG. 4 also illustrates that there may be a support sleeve encapsulation member 38 to help maintain the three parallel probes in proximate position during manufacturing of the device.

Thus, there has to this point been described the unique apparatus and methods of the present invention for providing a probe card testing apparatus which includes a pair of side by side and parallel probes for contacting a single conductive ball or contact point for the purpose and benefit of correcting contaminant layer IR voltage drops using Kelvin techniques. However, although the present invention has been described with respect to a specific apparatus reference, it is not intended that specific references be considered limitations upon the scope of the invention except as is set forth in the following claims.

We claim:

1. Apparatus for simultaneously making electrical contact with an array of spherical contact points having a first selected pattern on a circuit, comprising:

a support substrate having a working surface and a back side, said support substrate defining a multiplicity of apertures extending from said backside through said substrate and terminating at said working surface according to a second selected pattern corresponding to a mirror image of said first selected pattern;

a multiplicity of conductive probes, said conductive probes extending from a first end at said back side of said support substrate, through said apertures to a contact end located a selected distance beyond said working surface wherein said contact ends of said conductive probes are substantially flat;

at least one aperture of said multiplicity of apertures including at least two conductive probes extending there-through;

a multiplicity of conductive pathways extending from said first end of said conductive probes to selected circuitry; and said conductive probes positioned through said support substrate to make electrical contact with the spherical contact points on a circuit placed against said apparatus.

2. The apparatus of claim 1 wherein said conductive probes have a footprint at least as large as a diameter of the spherical contact points.

3. The apparatus of claim 1 wherein said contact points are conductive bumps or balls.

4. The apparatus of claim 1 wherein said at least two conductive probes extending through said at least one aperture are connected one each to a voltage source line and a voltage sensing device.

5. The apparatus of claim 4 further including a third conductive probe connected to another voltage source.

6. The apparatus of claim 1 wherein said apparatus is a probe card for testing integrated circuits.

7. Apparatus for simultaneously making electrical contact with an array of spherical contact points positioned according to a first selected pattern on a circuit comprising:

an insulating support substrate having a working surface and a back side;

a multiplicity of conductive probes, each of said conductive probes extending from a first end at said backside of said substrate, through said substrate to a contact end, contact ends of said multiplicity of conductive probes extending a selected distance beyond said working surface and terminating at a multiplicity of locations arranged according to a second selected pattern corresponding to a mirror image of said first selected pattern and wherein said contact ends of said conductive probes are substantially flat;

at least two conductive probes of said multiplicity of conductive probes having their ends adjacent each other at a single one of said multiplicity of locations; and said contact ends of conductive probes positioned through said support substrate to make electrical contact with selected ones of said spherical contact points on a circuit placed against said apparatus.

8. The apparatus of claim 7 wherein at least two of said multiplicity of locations include at least two of said conductive probes.

9. The apparatus of claim 7 wherein at least two of said multiplicity of locations include at least three of said conductive probes.

10. The apparatus of claim 7 wherein said apparatus is a probe card for testing integrated circuits.

11. The apparatus of claim 7 wherein said conductive probes have a footprint at least as large as a diameter of the spherical contact points.

12. The apparatus of claim 7 wherein said conductive probes have a footprint smaller than a diameter of the spherical contact points.

13. A method of manufacturing apparatus for simultaneously making electrical contact with an array of spherical contact points on circuitry, said array of contact points positioned according to a first selected pattern, comprising the steps of:

providing a support substrate having a working surface and a backside;

defining a multiplicity of apertures extending from said backside through said substrate and terminating at said working surface according to a second selected pattern, said second selected pattern corresponding to a mirror image of said first selected pattern;

extending each of a first end of a multiplicity of first conductive probes through each aperture of said multiplicity of apertures such that a first end of each of said first conductive probes is at said back side and a contact end of each of said first conductive probes extends a selected distance beyond said working surface;

extending a second conductive probe having a first end and a contact end through at least one of said multiplicity of apertures; and positioning said multiplicity of apertures such that said contact ends of said first conductive probes and said second conductive probes are aligned to make electrical contact with at least a portion of said array of spherical contact points of a circuit placed against said apparatus and wherein said contact end of said first conductive probes and said second conductive probes are substantially flat.

14. The method of claim 13 further comprising the steps of placing circuitry having an array of contact points against said apparatus and testing said circuitry.

15. The method of claim 13 wherein a selected probe of said multiplicity of first conductive probes is for supplying a selected voltage and said second conductive probe adjacent said selected probe is for sensing a voltage.

16. The method of claim 13 wherein said conductive probes have a footprint at least as large as a diameter of the spherical contact points.

17. The method of claim 13 wherein said conductive probes have a footprint smaller than a diameter of the spherical contact points.

18. A method of manufacturing apparatus for simultaneously making electrical contact with an array of spherical contact points on circuits, having said array of contact points positioned according to a first selected pattern, comprising the steps of:

providing a support substrate having a backside and a working surface;

extending a multiplicity of first conductive probes through said support substrate, each of said first conductive probes extending from a first end at said backside of said substrate, through said substrate to a contact end, said contact ends of said conductive probes extending a selected distance beyond said working surface and terminating at a multiplicity of locations according to a second selected pattern corresponding to a mirror image of said first selected pattern;

extending at least one second conductive probe having a first end and a contact end through said substrate, said contact end of said at least one second conductive probe terminating adjacent the contact end of one of said multiplicity of first conductive probes; and positioning said first conductive probes and said second conductive probe such that said contact ends of said first conductive probes and said second conductive probe are aligned so as to make electrical contact with said array of spherical contact points of a circuit placed against said apparatus and wherein said contact ends of said first and second conductive probes are substantially flat.

19. The method of claim 18 further comprising the steps of placing circuitry having an array of contact points against said apparatus and testing said circuitry.

20. The method of claim 18 wherein a selected probe of said multiplicity of first conductive probes is for supplying a selected voltage and said second conductive probe adjacent said selected probe is for sensing voltage.

21. The method of claim 18, wherein said conductive probes have a footprint at least as large as a diameter of the spherical contact points.

22. The method of claim 18 wherein said conductive probes have a footprint smaller than a diameter of the spherical contact points.

* * * * *